(12) United States Patent
Wada et al.

(10) Patent No.: US 8,536,583 B2
(45) Date of Patent: Sep. 17, 2013

(54) MOSFET AND METHOD FOR MANUFACTURING MOSFET

(75) Inventors: Keiji Wada, Osaka (JP); Shin Harada, Osaka (JP); Takeyoshi Masuda, Osaka (JP); Misako Honaga, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 403 days.

(21) Appl. No.: 13/063,298

(22) PCT Filed: Mar. 23, 2010

(86) PCT No.: PCT/JP2010/054952
§ 371 (c)(1),
(2), (4) Date: Mar. 10, 2011

(87) PCT Pub. No.: WO2010/110252
PCT Pub. Date: Sep. 30, 2010

(65) Prior Publication Data
US 2011/0169016 A1    Jul. 14, 2011

(30) Foreign Application Priority Data
Mar. 27, 2009   (JP) .................................. 2009-079408

(51) Int. Cl.
*H01L 29/15*   (2006.01)
*H01L 31/0312* (2006.01)
(52) U.S. Cl.
USPC ....... 257/77; 257/341; 257/E29.104; 438/105

(58) Field of Classification Search
USPC .................. 257/77, 341, E29.104; 438/105
See application file for complete search history.

(56) References Cited

U.S. PATENT DOCUMENTS

| 5,587,330 | A | 12/1996 | Yamazaki |
| 5,648,276 | A | 7/1997 | Hara et al. |
| 5,951,773 | A | 9/1999 | Jang et al. |
| 6,093,660 | A | 7/2000 | Jang et al. |
| 6,734,461 | B1 | 5/2004 | Shiomi et al. |
| 7,671,409 | B2 | 3/2010 | Kitabatake et al. |
| 8,421,086 | B2 * | 4/2013 | Harada et al. .................. 257/77 |

(Continued)

FOREIGN PATENT DOCUMENTS

| CN | 1802752 A | 7/2006 |
| EP | 1 689 000 A1 | 8/2006 |

(Continued)

OTHER PUBLICATIONS

Hiroyuki Matsunami et al., "Hetero-Interface Properties of $SiO_2$/4H-SiC on Various Crystal Orientations," IEICE Transactions on Electronics, vol. E86-C, No. 10, (2003), pp. 1943-1948.

(Continued)

*Primary Examiner* — Phat X Cao
(74) *Attorney, Agent, or Firm* — Venable LLP; Michael A. Sartori (57) ABSTRACT

A MOSFET includes: a silicon carbide (SiC) substrate having a main surface having an off angle of not less than 50° and not more than 65° relative to a {0001} plane; a semiconductor layer formed on the main surface of the SiC substrate; and an insulating film formed in contact with a surface of the semiconductor layer. The MOSFET has a sub-threshold slope of not more than 0.4 V/Decade.

10 Claims, 5 Drawing Sheets

(56) References Cited

U.S. PATENT DOCUMENTS

| | | |
|---|---|---|
| 2006/0220026 A1 | 10/2006 | Uchida et al. |
| 2007/0176230 A1 | 8/2007 | Uchida et al. |
| 2007/0290211 A1* | 12/2007 | Nakayama et al. ............ 257/77 |
| 2008/0265260 A1 | 10/2008 | Kitabatake et al. |
| 2008/0296622 A1 | 12/2008 | Kiewra et al. |
| 2009/0230404 A1* | 9/2009 | Masuda et al. ................. 257/77 |
| 2009/0243026 A1* | 10/2009 | Nakamura et al. ........... 257/471 |

FOREIGN PATENT DOCUMENTS

| | | |
|---|---|---|
| EP | 1 775 774 A1 | 4/2007 |
| JP | 3-145761 A | 6/1991 |
| JP | 7-099321 A | 4/1995 |
| JP | 10-27762 A | 1/1998 |
| JP | 2002-261275 A | 9/2002 |
| JP | 2005-166930 A | 6/2005 |
| JP | 2005-183943 A | 7/2005 |
| JP | 3854508 B2 | 12/2006 |
| JP | 4064436 B2 | 3/2008 |
| WO | WO-01/18872 A1 | 3/2001 |
| WO | WO-02/29874 A2 | 4/2002 |
| WO | WO-2009/017622 A1 | 2/2009 |

OTHER PUBLICATIONS

Search Report in European Patent Application No. 10756048.4-1552, dated Apr. 8, 2013.

Office Action in Chinese Patent Application No. 201080002563.4, dated Apr. 11, 2013.

* cited by examiner

MOSFET AND METHOD FOR MANUFACTURING MOSFET

TECHNICAL FIELD

The present invention relates to a MOSFET and a method for manufacturing the MOSFET.

BACKGROUND ART

Conventionally, a semiconductor device using a silicon carbide (SiC) has been known (for example, WO01/018872 (hereinafter, referred to as Patent Document 1)). Patent Document 1 describes that a SiC substrate of 4H (Hexagonal) poly type having a plane orientation of almost {03-38} is used to form a Metal-Oxide-Semiconductor Field-effect Transistor (MOSFET). It is also described that in the MOSFET, a gate oxide film is formed by means of dry oxidation (thermal oxidation). Patent Document 1 describes that such a MOSFET achieves large channel mobility (approximately 100 $cm^2/Vs$).

PRIOR ART DOCUMENTS

Patent Documents
Patent Document 1: WO 01/018872

SUMMARY OF THE INVENTION

Problems to be Solved by the Invention

However, as a result of analysis and review, the present inventor has found that the channel mobility in the above-described MOSFET occasionally fails to be sufficiently large. When the channel mobility is not large, excellent characteristics of the semiconductor device thus employing SiC cannot be exhibited stably.

The present invention is made to solve the foregoing problem, and an object of the present invention is to provide a MOSFET having improved channel mobility and a method for manufacturing such a MOSFET.

Means for Solving the Problems

The present inventor has diligently diagnosed what renders channel mobility small, in order to achieve large channel mobility in the MOSFET with good reproducibility as described above. As a result, the present invention has been accomplished. Specifically, the present inventor has found that the channel mobility becomes small due to a trap (hereinafter, also referred to as "interface state" or "interface state density") existing in an interface between the gate oxide film and the SiC semiconductor film positioned below the gate oxide film. This can be also presumed from a fact that the above-described MOSFET has a threshold voltage much higher than its theoretical value. To achieve a MOSFET with reduced influence of such an interface state, the present inventor has diligently studied and accordingly arrived at the present invention.

Specifically, a MOSFET of the present invention includes: a silicon carbide (SiC) substrate having a main surface having an off angle of not less than 50° and not more than 65° relative to a {0001} plane; a semiconductor layer formed on the main surface of the SiC substrate; and an insulating film formed in contact with a surface of the semiconductor layer, the MOSFET having a sub-threshold slope of not more than 0.4 V/Decade.

A method of the present invention for manufacturing a MOSFET includes the steps of: preparing a silicon carbide (SiC) substrate having a main surface having an off angle of not less than 50° and not more than 65° relative to a {0001} plane; forming a semiconductor layer on the main surface of the SiC substrate; and forming an insulating film in contact with a surface of the semiconductor layer, the MOSFET having a sub-threshold slope of not more than 0.4 V/Decade.

The present inventor has focused attention on the sub-threshold slope, which is associated with the interface state, and diligently studied a range of the sub-threshold slope so as to improve the mobility. As a result, the present inventor has found that by setting the sub-threshold slope at not more than 0.4 V/Decade, the interface state density can be reduced with good reproducibility near the interface between the insulating film and the semiconductor layer. In this way, most of carriers, which are to serve as an inversion channel layer, are prevented from being trapped in the interface state within the semiconductor layer at a region facing the insulating film. Therefore the channel mobility can be improved.

The lower limit of the off angle is set at 50° because it was observed that the carrier mobility is significantly increased as the off angle is increased in the course from a (01-14) plane in which the off angle is 43.3° to a (01-13) plane in which the off angle is 51.5° and because there is no natural plane in the range of the off angle between the (01-14) plane and the (01-13) plane.

Further, the upper limit of the off angle is 65° because it was observed that the carrier mobility is significantly decreased as the off angle is increased in the course of a (01-12) plane in which the off angle is 62.1° to a (01-10) plane in which the off angle is 90°, and because there is no natural plane in the range of the off angle between the (01-12) plane and the (01-10) plane.

The MOSFET preferably further includes a region including a nitrogen atom and interposed between the semiconductor layer and the insulating film.

In the MOSFET, a maximum value of nitrogen concentration is preferably $1 \times 10^{21}$ $cm^{-3}$ or greater in the region at a portion distant away by 10 nm or smaller from an interface between the semiconductor layer and the insulating film.

In the method for manufacturing the MOSFET, the step of forming the insulating film preferably includes the steps of: forming the insulating film through dry oxidation; and thermally treating the insulating film using gas including a nitrogen atom as atmospheric gas.

The present inventor has found that the influence of the interface state is reduced by increasing the concentration of nitrogen atom near the interface between the semiconductor layer and the insulating film. This achieved a MOSFET allowing for further improved channel mobility.

In the MOSFET, preferably, the semiconductor layer is formed of SiC. SiC, which has a large band gap, has a maximum dielectric breakdown electric field and a heat conductivity both larger than those of silicon (Si), and allows for carrier mobility as large as that in silicon. Also, in SiC, saturation drift velocity of electrons and withstand voltage are large. Accordingly, a MOSFET can be achieved which allows for high efficiency, high voltage, and large capacitance.

In the MOSFET, the main surface of the SiC substrate may have an off orientation falling within a range of ±5° of a <11-20> direction.

The <11-20> direction is a representative off orientation in the SiC substrate. Variation of the off orientation, which is caused by variation, etc., in a slicing process in a step of manufacturing the substrate, is set to be ±5°, thereby facilitating formation of an epitaxial layer on the SiC substrate, and the like. In this way, the MOSFET can be manufactured readily.

In the MOSFET, the main surface of the SiC substrate may have an off orientation falling within a range of ±5° of a <01-10> direction.

As with the <11-20> direction described above, the <01-10> direction is a representative off orientation in the SiC substrate. Variation of the off orientation, which is caused by variation, etc., in a slicing process in a step of manufacturing the substrate, is set to be ±5°, thereby facilitating formation of an epitaxial layer on the SiC substrate, and the like. In this way, the MOSFET can be manufactured readily.

In the MOSFET, the main surface of the SiC substrate can have an off angle of not less than −3° and not more than +5° relative to a (0-33-8) plane in the <01-10> direction.

In this way, the channel mobility can be further improved. Here, the off angle is thus set at not less than −3° and not more than +5° relative to the plane orientation {03-38} because particularly high channel mobility was obtained in this range as a result of inspecting a relation between the channel mobility and the off angle.

Here, the state in which "the off angle is not less than −3° and not more than +5° relative to plane orientation {03-38}" refers to a state in which the orthogonal projection of a normal line of the main surface to a flat plane defined by the <0001> direction and the <01-10> direction serving as a reference for the off orientation forms an angle of not less than −3° and not more than +5° relative to a normal line of the {03-38} plane. The sign of a positive value corresponds to a case where the orthogonal projection approaches in parallel with the <01-10> direction whereas the sign of a negative value corresponds to a case where the orthogonal projection approaches in parallel with the <0001> direction.

It should be noted that the plane orientation of the main surface thereof is more preferably substantially {03-38} and the plane orientation of the main surface thereof is further preferably {03-38}. Here, the expression "the plane orientation of the main surface is substantially {03-38}" indicates that the plane orientation of the main surface of the substrate is included in a range of the off the angle in which the plane orientation of the substrate can be regarded as substantially {03-38} in consideration of precision of processing the substrate and the like. The range of the off angle in this case is a range in which the off angle is ±2° relative to {03-38}, for example. In this way, the above-described channel mobility can be improved further.

In the MOSFET, the main surface of the substrate has an off angle of not less than −3° and not more than +5° relative to a (0-33-8) plane in the <01-10> direction.

In particular, a structure is employed in which a semiconductor layer and an insulating film are formed on a surface close to the (0-33-8) plane, which is a plane close to the C (carbon) plane in the {03-38} plane. In this way, the carrier mobility is improved significantly.

Here, in the present application, the (0001) plane of single-crystal silicon carbide of hexagonal crystal is defined as the silicon plane whereas the (000-1) plane is defined as the carbon plane. Meanwhile, the "off angle relative to the (0-33-8) plane in the <01-10> direction" refers to an angle formed by the orthogonal projection of a normal line of the main surface to a flat plane defined by the <000-1> direction and the <01-10> direction serving as a reference for the off orientation, and a normal line of the (0-33-8) plane. The sign of a positive value corresponds to a case where the orthogonal projection approaches in parallel with the <01-10> direction, whereas the sign of a negative value corresponds to a case where the orthogonal projection approaches in parallel with the <000-1> direction. Further, the expression "the main surface having an off angle of not less than −3° and not more than +5° relative to the (0-33-8) plane in the <01-10> direction" indicates that the main surface corresponds to a plane, at the carbon plane side, which satisfies the above-described conditions in the silicon carbide crystal. It should be noted that in the present application, the (0-33-8) plane includes an equivalent plane, at the carbon plane side, which is expressed in a different manner due to determination of an axis for defining a crystal plane, and does not includes a plane at the silicon plane side.

Effects of the Invention

As described above, the MOSFET and the method for manufacturing the MOSFET according to the present invention allow for improved channel mobility by setting the sub-threshold slope at not more than 0.4 V/Decade.

MODES FOR CARRYING OUT THE INVENTION

The following describes an embodiment of the present invention with reference to figures. It should be noted that in the below-mentioned figures, the same or corresponding portions are given the same reference characters and are not described repeatedly. It should be also noted that in the present specification, an individual orientation is represented by [ ], a group orientation is represented by < >, an individual plane is represented ( ), by and a group plane is represented by { }. In addition, crystallographically, a negative index is supposed to be indicated by putting a bar "−" above a numeral, but instead is indicated by putting a negative sign before the numeral in the present specification.

Figure 1:
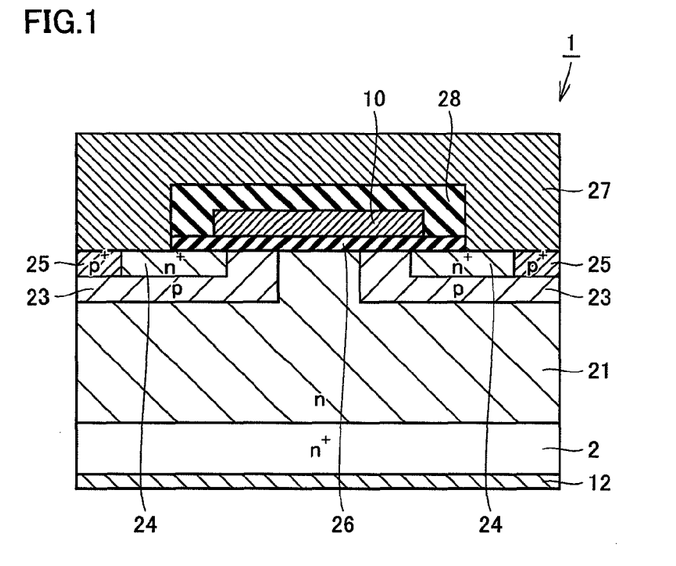
FIG. 1 is a cross sectional view schematically showing a MOSFET of an embodiment of the present invention.

Referring to FIG. 1, a MOSFET 1 of one embodiment of the present invention will be described. MOSFET 1 of the present embodiment is a MOSFET of vertical type.

MOSFET 1 includes a substrate 2, a semiconductor layer 21, well regions 23, source regions 24, contact regions 25, an insulating film 26, a gate electrode 10, a source electrode 27, an interlayer insulating film 28, and a drain electrode 12.

Figure 2:
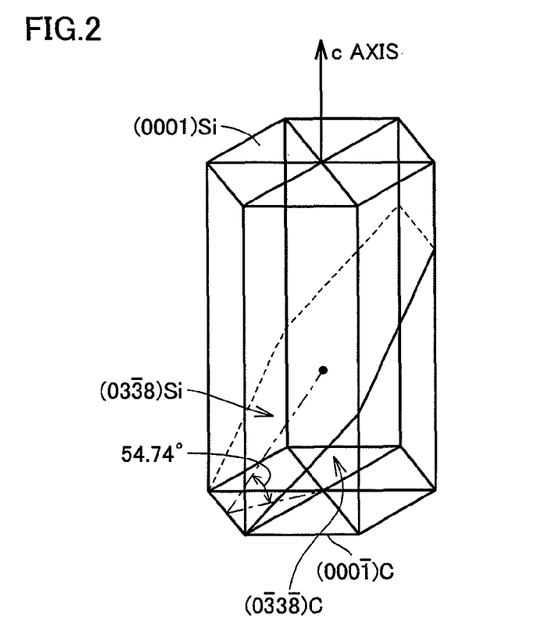
FIG. 2 illustrates a {03-38} plane in the embodiment of the present invention.

Substrate 2 is, for example, an n⁺ SiC substrate. Substrate 2 has a main surface having an off angle of not less than 50° and not more than 65° relative to a {0001} plane. Preferably, the main surface thereof is a {03-38} plane. Here, as shown in FIG. 2, the {03-38} plane is a plane having a tilt of approximately 55°(54.7°) relative to the {0001} plane. In other words, the {03-38} plane is a plane having a tilt of approximately 35° (35.3°) relative to the direction of a <0001> axis.

It should be noted that the main surface of substrate 2 may have an off orientation falling within a range of ±5° of the <11-20> direction or a range of ±5° of the <01-10> direction. Further, the plane orientation of the main surface of substrate 2 may have an off angle of not less than −3° and not more than +5° relative to the plane orientation {03-38}. Furthermore, the main surface of substrate 2 may have an off angle of not less than −3° and not more than +5° relative to the (0-33-8) plane in the <01-10> direction. In these cases, channel mobility can be improved. In particular, by setting the plane orientation of the main surface of substrate 2 to (0-33-8), the channel mobility can be improved more.

On the main surface of substrate 2, a semiconductor layer 21 formed of, for example, an n type SiC is formed. Each of well regions 23 is positioned in a portion of the main surface of semiconductor layer 21 so as to form a pn junction with semiconductor layer 21. Well region 23 is a p type SiC, for example. Each of source regions 24 is positioned in a portion of the main surface thereof within well region 23 so as to form a pn junction with well region 23. Source region 24 is a SiC, for example. Each of contact regions 25 is positioned in a portion of the main surface thereof within well region 23 so as to form a pn junction with source region 24. Contact region 25 is a SiC, for example.

Semiconductor layer 21 is of the same conductive type (n) as that of source region 24, and has an impurity concentration lower than that of source region 24. Semiconductor layer 21 has a thickness of for example 10 μm. It is not particularly limited as to which one of the impurity concentration of semiconductor layer 21 and the impurity concentration of source region 24 is higher or lower. Source region 24 preferably has an impurity concentration higher than that of semiconductor layer 21, for example, has an impurity concentration of $1 \times 10^{18}$ cm⁻³ to $1 \times 10^{20}$ cm⁻³. Examples of the n type impurity usable are: nitrogen (N), phosphorus (P), and the like.

Further, well region 23 is of a second conductive type (p) different from that of semiconductor layer 21. Examples of the p type impurity usable are: aluminum (Al), boron (B), and the like. Well region 23 has an impurity concentration of, for example, $5 \times 10^{15}$ cm³ to $5 \times 10^{18}$ cm³¹³.

A region between source region 24 and semiconductor layer 21 in well region 23 serves as a channel of MOSFET 1. In the present embodiment, the conductive type thereof is determined to form an n channel, but the first and second conductive types may be determined in a manner opposite to that in the above-described case, so as to form a p channel.

Insulating film 26 insulates between semiconductor layer 21 and gate electrode 10, and is formed on and in contact with well region 23 between source region 24 and semiconductor layer 21.

Gate electrode 10 is formed on insulating film 26 to face at least well region 23 between source region 24 and semiconductor layer 21. It should be noted that gate electrode 10 may be also formed on another region as long as it is formed above well region 23 so as to face well region 23 between source region 24 and semiconductor layer 21.

On source region 24 and contact region 25, source electrode 27 is formed and is electrically connected to source region 24 and contact region 25. Source electrode 27 is electrically insulated from gate electrode 10 by insulating film 26. Further, drain electrode 12 is formed on an opposite surface of substrate 2 to its surface making contact with semiconductor layer 21, and is thus electrically connected to substrate 2.

MOSFET 1 has a sub-threshold slope of 0.4 V/Decade or smaller. This leads to reduced interface state density, thereby achieving a large mobility.

Now, the sub-threshold slope will be described. The term "sub-threshold slope (also referred to as "sub-threshold swing", "S value", or the like)" indicates a gate voltage not more than a threshold voltage and required to increase current flowing between the source and the drain by one digit. The sub-threshold slope is expressed by the following Formula 1 with the gate voltage being represented by $V_G$ and the drain current being represented by $I_D$.

$$S \equiv \ln 10 \cdot \frac{dV_G}{d(\ln I_D)} \quad \text{[Formula 1]}$$

Further, a region including nitrogen atoms is preferably formed at an interface between semiconductor layer 21 and insulating film 26. For example, a region distant away from the interface between semiconductor layer 21 and insulating film 26 by 10 nm or smaller preferably has a nitrogen concentration of $1 \times 10^{21}$ cm⁻³ at maximum. In this case, mobility (channel mobility) can be at a sufficiently large value in a channel region having a channel length (region between well regions 23 in semiconductor layer 21).

This is considered to be attained due to the following reasons. That is, when insulating film 26 is formed through thermal oxidation or the like, a multiplicity of interface states are formed in the interface between insulating film 26 and semiconductor layer 21. This will result in extremely small channel mobility in the channel region, if nothing is done therefor. To counteract this problem, the nitrogen atoms are introduced into the region at the interface between insulating film 26 and semiconductor layer 21 as described above. In this way, the channel mobility can be improved while reducing the influences of the interface states.

The following describes a method for manufacturing MOSFET 1 in the present embodiment.

Figure 3:
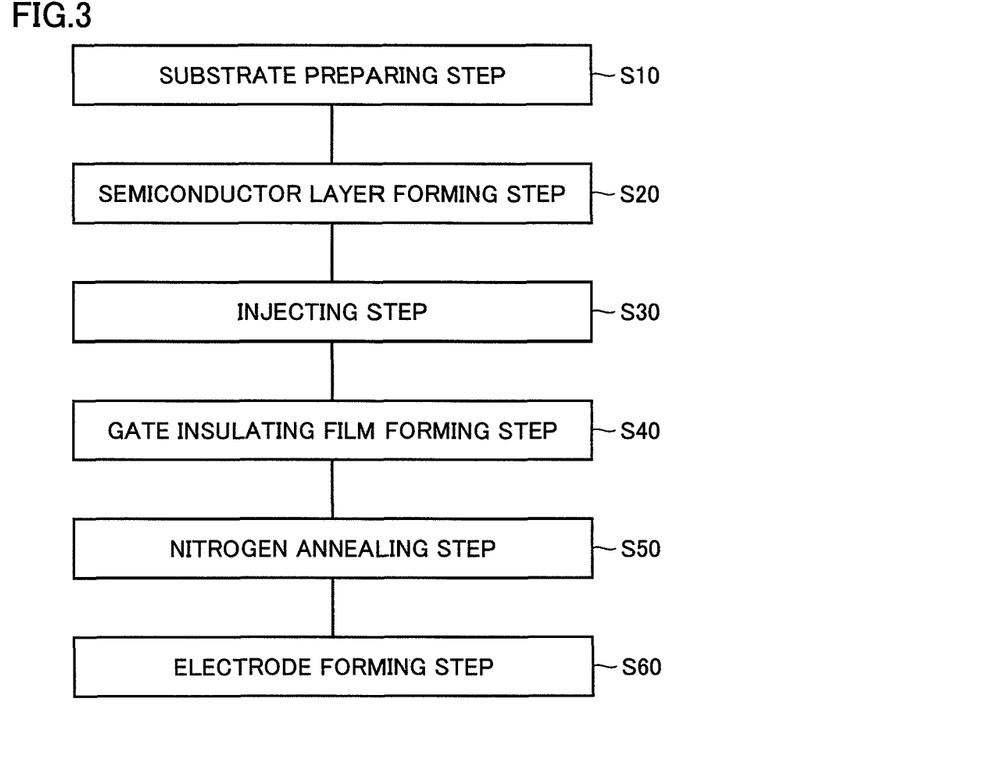
FIG. 3 is a flowchart showing a method for manufacturing the MOSFET in the embodiment of the present invention.

First, as shown in FIG. 3, a substrate preparing step (S10) is performed. In this step, a SiC substrate whose conductive type is n type is prepared as substrate 2. The SiC substrate thus prepared has a main surface having an off angle of not less than 50° and not more than 65° relative to a plane orientation {0001}, for example, having a plane orientation of (03-38) or (0-33-8). Such a substrate can be obtained by slicing an ingot having the (0001) plane as its main surface into substrate 2 so that the (03-38) plane or (0-33-8) plane thereof is exposed as the main surface, for example. In this step, for further improvement of the channel mobility in MOSFET 1 to be manufactured, it is particularly preferable to prepare substrate 2 having the (0-33-8) plane as its main surface. Further, as substrate 2, a substrate having a specific resistance of 0.02 Ωcm may be used, for example.

Figure 4:
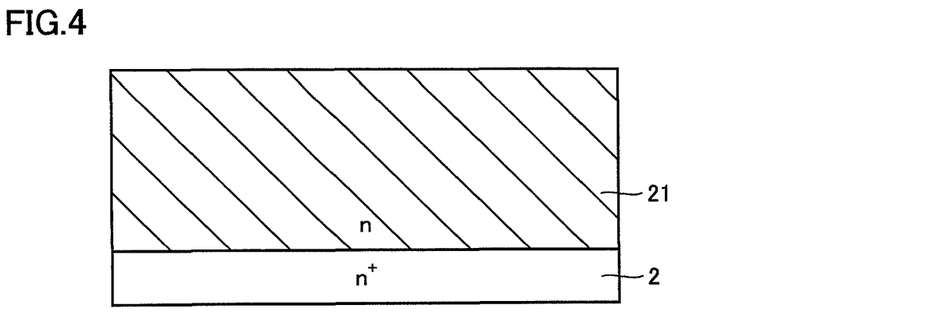
FIG. 4 is a schematic cross sectional view illustrating a step of the method for manufacturing the MOSFET of the embodiment of the present invention.

Then, a semiconductor layer forming step (S20) is performed. Specifically, as shown in FIG. 4, semiconductor layer 21 is formed on the main surface of substrate 2. Semiconductor layer 21 is formed of SiC whose conductive type is n type, and has a thickness of 10 µm, for example. Further, n type impurity in semiconductor layer 21 can have a concentration of $1\times10^{16}$ cm$^{-3}$.

Figure 5:
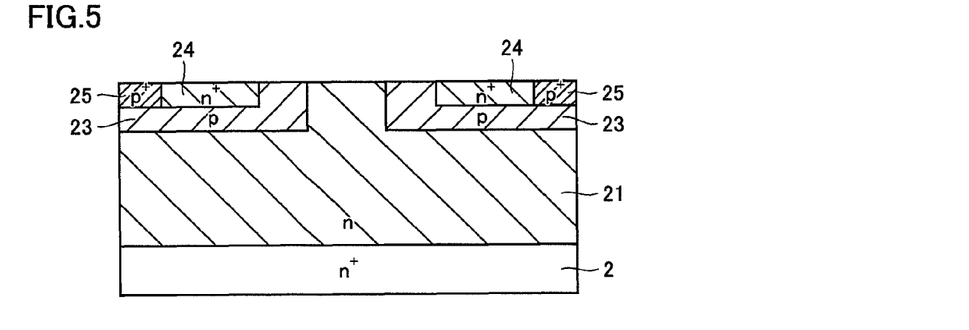
FIG. 5 is a schematic cross sectional view illustrating a step of the method for manufacturing the MOSFET of the embodiment of the present invention.

Then, an injecting step (S30) is performed. Specifically, impurity (for example, Al) whose conductive type is p type is injected into semiconductor layer 21, using as a mask an oxide film formed by means of photolithography and etching. In this way, well regions 23 are formed as shown in FIG. 5. Thereafter, the oxide film thus used is removed and an oxide film having a new pattern is formed using photolithography and etching. Using this oxide film as a mask, n type conductive impurity (for example, P) is injected into predetermined regions to form source regions 24. In a similar way, conductive impurity whose conductive type is p type is injected to form contact regions 25. As a result, a structure shown in FIG. 5 is obtained.

After such an injecting step (S30), activation annealing treatment is performed. This activation annealing treatment can be performed under conditions that, for example, argon (Ar) gas is employed as atmospheric gas, heating temperature is in a range of 1700-1800° C., and heating time is 30 minutes. This activation annealing activates the impurity in the ion-injected region, and restores crystallinity.

Figure 6:
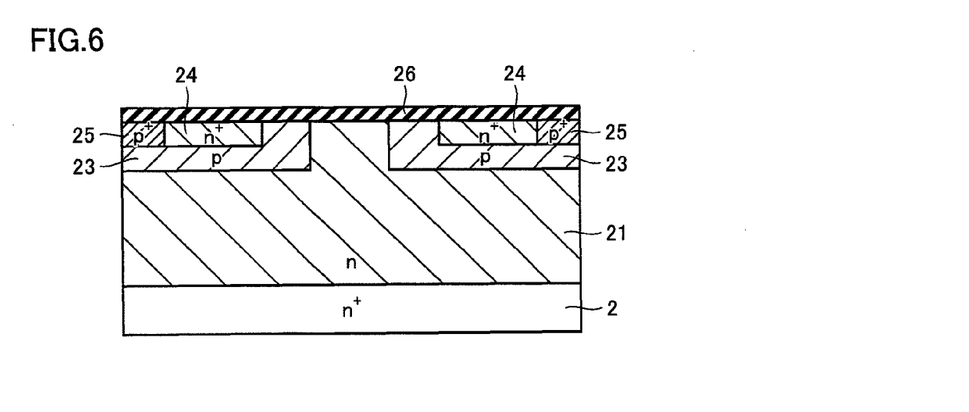
FIG. 6 is a schematic cross sectional view illustrating a step of the method for manufacturing the MOSFET of the embodiment of the present invention.

Next, a gate insulating film forming step (S40) is performed. Specifically, as shown in FIG. 6, insulating film 26 is formed to cover semiconductor layer 21, well regions 23, source regions 24, and contact regions 25. The formation of insulating film 26 may be performed through dry oxidation (thermal oxidation), for example. This dry oxidation can be performed under conditions that, for example, heating temperature is 1200° C., heating time is 30 minutes, and the like. The insulating film can be formed to have a thickness of, for example, 40 nm.

Then, a nitrogen annealing step (S50) is performed. Specifically, gas including nitrogen (N) atoms, such as nitrogen monoxide (NO) gas or dinitrogen oxide ($N_2O$) gas, is used as atmospheric gas for heat treatment. The atmospheric gas is preferably nitrogen oxide.

The heat treatment can be performed under conditions that, for example, heating temperature is not less than 1100° C. and not more than 1300° C. and heating time is not less than 30 minutes and not more than 120 minutes. As a result, the nitrogen atoms can be introduced into the vicinity of the interface between insulating film 26 and each of semiconductor layer 21, well regions 23, source regions 24, and contact regions 25, each of which is positioned below insulating film 26.

After this nitrogen annealing step, additional annealing may be performed using Ar gas, which is inert gas. Specifically, the annealing may be performed using the Ar gas as the atmospheric gas, under conditions that heating temperature is 1100° C. and heating time is 60 minutes.

In addition, after the nitrogen annealing step, surface cleaning may be performed, such as organic cleaning, acid cleaning, or RCA cleaning.

Figure 7:
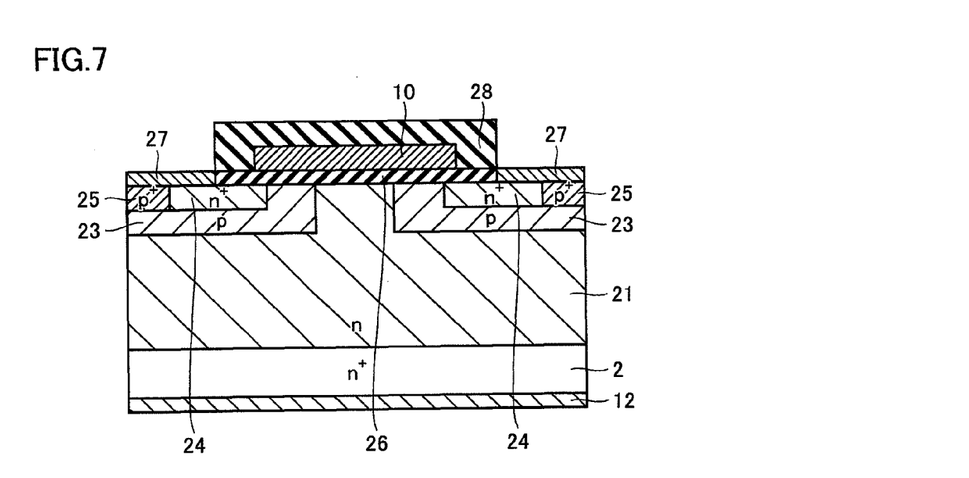
FIG. 7 is a schematic cross sectional view illustrating a step of the method for manufacturing the MOSFET of the embodiment of the present invention.

Next, an electrode forming step (S60) is performed. Specifically, on insulating film 26, a layer of high-concentration n type poly Si or the like, which is to be gate electrode 10, is formed using a CVD (chemical vacuum deposition) method. On this layer, a resist film having a pattern provided with an opening at a region other than the region to be gate electrode 10 is formed using the photolithography method. Using this resist film as a mask, the layer's portion exposed from the pattern is removed by means of RIE (Reactive Ion Etching) or the like. In this way, gate electrode 10 can be formed as shown in FIG. 7.

Then, an insulating film formed of $SiO_2$ or the like, which is to be interlayer insulating film 28, is formed using the CVD method so as to cover gate electrode 10. For example, silicon oxide ($SiO_2$) or silicon nitride ($Si_3N_4$) may be deposited using the CVD method or a plasma CVD method. For example, $SiO_2$ may be deposited using the plasma CVD method thereon by for example 1 µm, under conditions that a raw material gas of tetraethoxysilane (TEOS) and oxygen ($O_2$) is used and heating temperature is 350° C. On the insulating film, a resist film having a pattern provided with an opening at a region other than the region to be interlayer insulating film 28 is formed using the photolithography method. Using the resist film as a mask, the insulating film's portion exposed from the pattern is removed using the RIE. In this way, interlayer insulating film 28 having openings can be formed as shown in FIG. 7.

Next, on interlayer insulating film 28, a resist film is formed using the photolithography method. The resist film has a pattern for exposing a portion of each source region 24 and each contact region 25. On the pattern and the resist, a conductive film of Ni or the like is formed. Thereafter, by removing (lifting off) the resist, a portion of each source electrode 27 can be formed in contact with source region 24 and contact region 25 each of which is exposed from insulating film 26 and interlayer insulating film 28. Further, drain electrode 12 is formed on the back-side surface of substrate 2. For drain electrode 12, nickel (Ni) can be used, for example. After forming source electrode 27 and drain electrode 12, heat treatment for alloying is performed, for example. In this way, a portion of source electrode 27 and drain electrode 12 can be formed as shown in FIG. 7.

Then, on the formed portion of source electrode 27, upper source electrode 27 is formed. Upper source electrode 27 can be formed by means of, for example, lift-off, etching, or the like.

As described above, MOSFET 1 of the present embodiment includes: SiC substrate 2 having a main surface having an off angle of not less than 50° and not more than 65° relative to the {0001} plane, preferably, having the {03-38} plane; semiconductor layer 21 formed on SiC substrate 2; and insulating film 26 formed in contact with the surface of semiconductor layer 21, and MOSFET 1 has a sub-threshold slope of not more than 0.4 V/Decade.

Meanwhile, the method for manufacturing MOSFET 1 in the present embodiment includes: the substrate preparing step (S10) of preparing SiC substrate 2 having a main surface having an off angle of not less than 50° and not more than 65° relative to the {0001} plane, preferably, having a {03-38} plane as the main surface; the semiconductor layer forming step (S20) of forming semiconductor layer 21 on SiC substrate 2; and the gate insulating film forming step (S40) of forming insulating film 26 in contact with the surface of semiconductor layer 21, and MOSFET 1 has a sub-threshold slope of not more than 0.4 V/Decade.

The present inventor has found that by setting the sub-threshold slope at not more than 0.4 V/Decade, interface state density in the vicinity of the interface between insulating film 26 and semiconductor layer 21 can be reduced effectively. This restrains most of carriers, which are to serve as an inversion channel layer, from being trapped in the interface states at the region facing insulating film 26 in semiconductor layer 21. This further prevents trapped carriers from behaving as fixed charges. Accordingly, applied voltage (threshold voltage) to the gate electrode can be maintained to be small, whereby most of the carriers contribute to a current between the source and the drain. Thus, MOSFET 1 allowing for improved channel mobility is obtained. As such, in the present embodiment, a large channel mobility can be realized with good reproducibility, thus allowing the excellent characteristics of MOSFET 1 to be exhibited stably.

First Example

In the present example, the effect of improving mobility in a MOSFET by setting the sub-threshold slope thereof at not more than 0.4 V/Decade was examined.

The Present Invention's Examples 1 and 2

Figure 8:
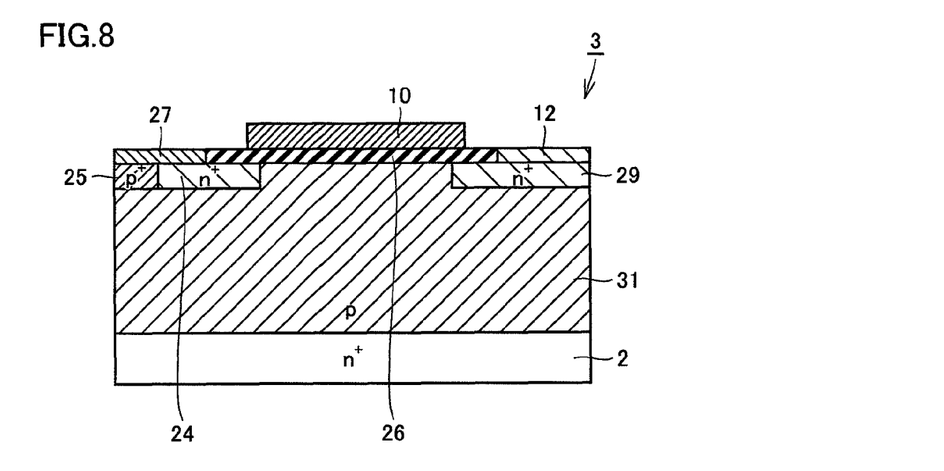
FIG. 8 is a cross sectional view schematically showing each of MOSFETs of the present invention's examples 1 and 2.

As each of the MOSFETs of the present invention's examples 1 and 2, a MOSFET 3 of lateral type basically as shown in FIG. 8 was manufactured.

Specifically, first, in the substrate preparing step (S10), as substrate 2, a 4H—SiC substrate was prepared which had the (03-38) plane as the main surface thereof.

Next, in the semiconductor layer forming step (S20), as semiconductor layer 31, a p type SiC layer was formed which had a thickness of approximately 0.8 µm and had an impurity concentration of $1 \times 10^{16}$ cm$^{-3}$. The main surface of the p type SiC layer corresponded to the (03-38) plane.

Next, in the injecting step (S30), SiO$_2$ was used as the mask material. Using P as n type impurity, source regions 24 and drain regions 29 were formed to have an impurity concentration of $1 \times 10^{19}$ cm$^{-3}$. Meanwhile, using Al as p type impurity, contact regions 25 were formed to have an impurity concentration of $1 \times 10^{19}$ cm$^{-3}$.

After the injecting step (S30), activation annealing treatment was performed. The conditions of the activation annealing treatment were: Ar gas was used as an atmospheric gas, heating temperature was 1700-1800° C., and heating time was 30 minutes.

Then, in the gate insulating film forming step (S40), a gate oxide film was formed as insulating film 26 by means of dry oxidation, under conditions that heating temperature was 1200° C., and heating time was 30 minutes in the present invention's example 1 and 45 minutes in the present invention's example 2. In addition, surface cleaning was performed.

Then, in the nitrogen annealing step (S50), in an atmosphere including NO, heat treatment was performed under conditions that heating temperature was 1100° C. in the present invention's example 1 and 1200° C. in the present invention's example 2 and heating time was 120 minutes.

Next, in the electrode forming step (S60), gate electrode 10 formed of poly Si, source electrode 27 formed of Ni, and drain electrode 12 formed of Ni were formed.

By performing the steps (S10-S60), MOSFETs 3 of the present invention's examples 1 and 2 were manufactured.

Comparative Example 1

A MOSFET of a comparative example 1 was manufactured in basically the same way as the MOSFET of the present invention's example 1, but was different therefrom in conditions in that the main surface of the substrate was the (0001) plane, the nitrogen annealing step (S50) was not performed, and heating temperature was 1300° C. and heating time was 20 minutes in the gate insulating film forming step (S40).

Comparative Example 2

A MOSFET of a comparative example 2 was manufactured in basically the same way as the MOSFET of the present invention's example 1, but was different in that the main surface of the substrate was the (0001) plane, heating temperature was 1300° C. and heating time was 30 minutes in the gate insulating film forming step (S40), and heating temperature was 1300° C. and heating time was 60 minutes in the nitrogen annealing step (S50).

Comparative Example 3

A MOSFET of a comparative example 3 was manufactured in basically the same way as the MOSFET of the present invention's example 1, but was different therefrom in that the main surface of the substrate was the (0001) plane, heating temperature was 1300° C. and heating time was 30 minutes in the gate insulating film forming step (S40), and heating temperature was 1200° C. and heating time was 60 minutes in the nitrogen annealing step (S50).

Measuring Method

The mobility and sub-threshold slope of each of the MOSFETs of the present invention's examples 1 and 2 and comparative examples 1-3 were measured.

Specifically, for the mobility thereof a source-drain current $I_{DS}$ was measured while applying a gate voltage $V_G$ with a source-drain voltage $V_{DS}$=0.1 V (gate voltage dependency was measured). Then, the maximum value of the mobility relative to the gate voltage was determined as follows:

Channel mobility $\mu = g_m \times (L \times d)/(W \times \epsilon \times V_{DS})$, where $g_m = (\delta I_{Ds})/(\delta V_G)$, L indicates a gate length, d indicates the thickness of the oxide film, W indicates a gate width, and $\epsilon$ indicates the permittivity of the oxide film.

The sub-threshold slope was measured as follows. While applying gate voltage $V_G$ with source-drain voltage $V_{DS}$=0.1V, the sub-threshold slope was measured using Formula 1 in a range in which gate voltage $V_G$ was equal to or smaller than the threshold voltage at a straight line region in a semilogarithmic plot of source-drain current $I_{DS}$ relative to the gate voltage. The result is shown in FIG. 9.

Figure 9:
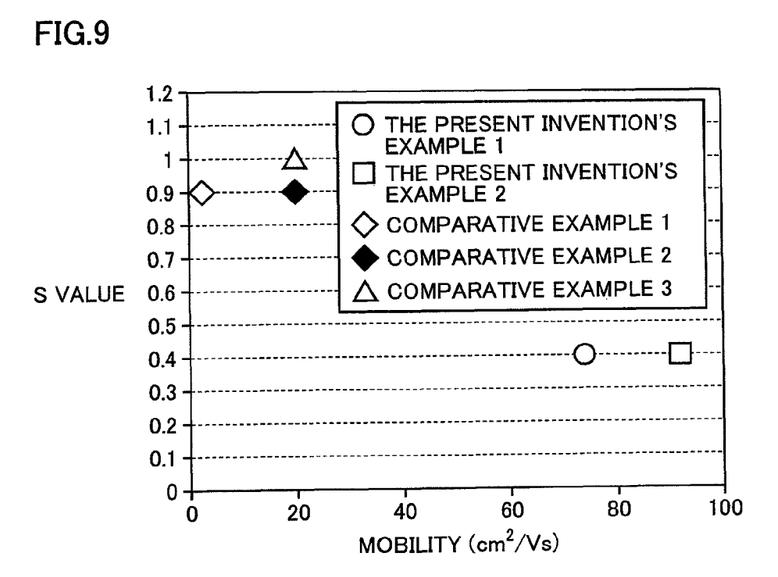
FIG. 9 shows a relation between mobility and sub-threshold slope in a first example.

As shown in FIG. 9, the MOSFETs of the present invention's examples 1 and 2, each of which has a sub-threshold slope of 0.4, achieved a high mobility of not less than 74 (cm$^2$/Vs) and not more than 92 (cm$^2$/Vs). On the other hand, the MOSFETs of comparative examples 1-3, each of which has a sub-threshold slope of 0.9-1.0, had a low mobility of not less than 2.5 (cm$^2$Ns) and not more than 20 (cm$^2$/Vs).

As such, according to the present example, it has been found that the mobility can be improved by setting the sub-threshold slope at not more than 0.4 V/Decade.

In the present example, the SiC substrate having the (03-38) plane as its main surface was employed as substrate 2, but the present inventor has found that the mobility can be further improved when using a SiC substrate having the (0-33-8) plane as its main surface.

Second Example

In the present example, the effect of achieving reduced interface state density by setting the sub-threshold slope at not more than 0.4 V/Decade was examined.

Generally, the interface state density is determined from the sub-threshold slope (S value) as follows. In Formula 2 described below, a theoretical S value obtained upon interface state density $D_{it}$=0 can be determined using a known insulating film capacity $C_{ox}$, and a depletion layer capacity $C_d$ upon strong inversion (calculated from the maximum width of the depletion layer upon strong inversion, for example).

$$S \equiv \ln 10 \cdot \frac{kT}{q}\left(1 + \frac{C_d + C_{it}}{C_{OX}}\right) \quad \text{[Formula 2]}$$

In Formula 2, k indicates a Boltzmann's constant, T indicates an absolute temperature, $C_d$ indicates the depletion layer capacity upon strong inversion, $C_{it}$ indicates the interface state capacity ($C_{it}=qD_{it}$), and $C_{ox}$ indicates an oxide film capacity.

By comparing the S values in Formula 2 and the first example, interface state capacity $C_{it}$ can be calculated to derive interface state density $D_{it}$. However, it was found that $D_{it}$ determined in accordance with Formula 2 is not so precise. In view of this, in the present example, a MOS capacitor 30 shown in FIG. 10 was fabricated as described below. In accordance with the capacitance/voltage characteristics thereof, interface state density $D_{it}$ was determined with improved precision and was examined.

The Present Invention's Example 3

Figure 10:
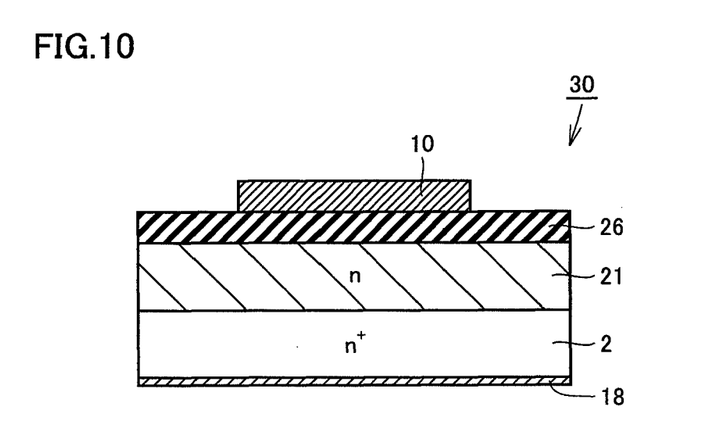
FIG. 10 is a cross sectional view schematically showing a MOS capacitor fabricated in a second example.

Specifically, first, as substrate 2, a substrate similar to that in the substrate preparing step (S10) of the present invention's example 1 was used.

Next, a semiconductor layer 21 similar to that in the semiconductor layer forming step (S20) of the present invention's example 1 was formed on substrate 2.

Then, an insulating film 26 similar to that in the gate insulating film forming step (S40) of the present invention's example 1 was formed on semiconductor layer 21.

Then, the nitrogen annealing step (S50) was performed in a manner similar to that in the present invention's example 1, except that heating temperature was 1100° C. and heating time was 60 minutes.

Then, on insulating film 26, a gate electrode 10 similar to that in the electrode forming step (S60) of the present invention's example 1 was formed. Further, as back-side contact electrode 18, Ni was formed.

In this way, the MOS capacitor of the present invention's example 3 was manufactured.

Comparative Example 4

A MOS capacitor of a comparative example 4 was manufactured in basically the same way as the MOS capacitor of the present invention's example 3, but was different therefrom in that heating temperature was 1200° C. and heating time was 30 minutes in the gate insulating film forming step (S40) and the nitrogen annealing step (S50) was not performed.

Comparative Example 5

A MOS capacitor of a comparative example 5 was manufactured in basically the same way as the MOS capacitor of the present invention's example 3, but was different therefrom in that the main surface of the substrate was the (0001) plane and heating temperature was 1300° C. and heating time was 60 minutes in the nitrogen annealing step (S50).

Measuring Method

Energy and interface state density in each of the MOS capacitors of the present invention's example 3 and comparative examples 4 and 5 were measured. It should be noted that the energy herein refers to energy in a band gap with respect to the bottom of the conduction band at the semiconductor layer side of the MOS interface (interface between semiconductor layer 21 and insulating film 26).

The interface state density was measured in accordance with capacitance C/voltage V characteristics by means of a High-Low method. The result thereof is shown in FIG. 11.

Figure 11:
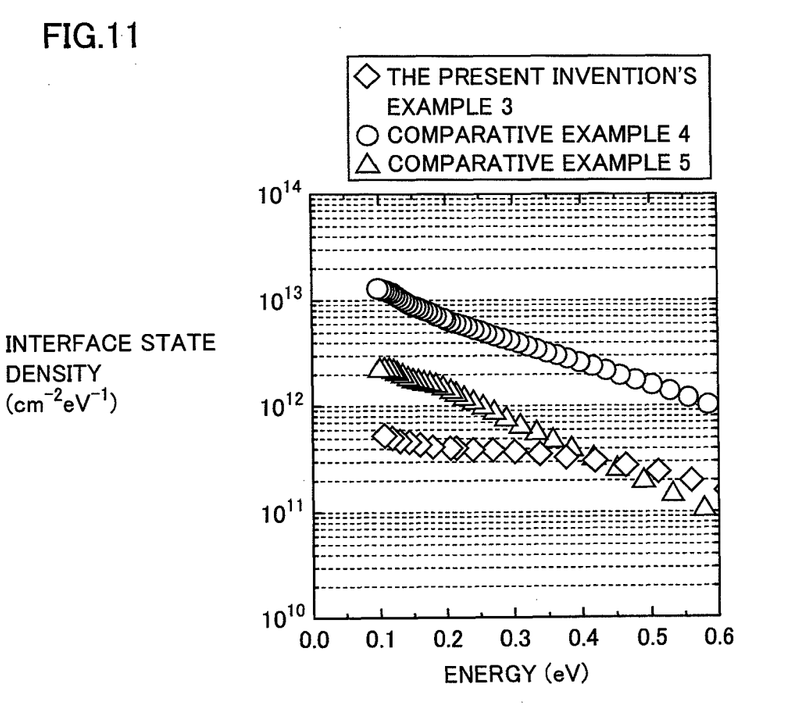
FIG. 11 shows a relation between energy and interface state density in the second example.

As shown in FIG. 11, in the MOS capacitor of the present invention's example 3, the interface states at the MOS interface were low. From this fact, it was found that insulating film 26 was thermally treated using gas including nitrogen atoms as the atmospheric gas, thereby achieving reduced interface state density.

Further, when manufacturing a MOSFET under the conditions for the MOS capacitor of the present invention's example 3, the MOSFET had a sub-threshold slope of not more than 0.4. As such, it was found that the interface state density can be reduced by setting the sub-threshold slope at not more than 0.4.

It is considered that such a reduced interface state density provides the following effect. That is, inversion electrons can be reduced which does not contribute to the current between the source and the drain and are trapped in the interface states. This can reduce an applied gate voltage, i.e., threshold voltage, required to form inversion channel electrons necessary to let a current flow sufficiently between the source and the drain. Because the interface state density can be reduced by setting the sub-threshold slope at not more than 0.4 as such, it is considered that the mobility therein can be improved.

On the other hand, in the MOS capacitors of comparative examples 4 and 5, the interface states at the MOS interface were high. When manufacturing a MOSFET under the conditions for the MOS capacitor of comparative examples 4 and 5, the MOSFET had a sub-threshold slope of more than 0.4. Accordingly, it is considered that the threshold voltage is large because when inversion channel electrons are trapped in the MOS interface, the mobility in the MOSFET is decreased and they accordingly behave as negative fixed charges. In Patent Document 1, the nitrogen annealing step (S50) is not performed as in comparative example 4. Hence, it is considered that in Patent Document 1, the interface state density is as large as that in comparative example 4. Accordingly, it can be said that high mobility is hardly achieved with good reproducibility in the MOSFET of Patent Document 1.

As described above, according to the present example, it has been found that by setting the sub-threshold slope at not more than 0.4 V/Decade, the interface state density can be reduced to improve the mobility. In addition, it is considered that such a large channel mobility can be realized with good reproducibility.

Although the embodiments and examples of the present invention have been described thus far, it is initially expected to appropriately combine features of the embodiments and the examples. In addition, the embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

Industrial Applicability

The present invention is advantageously applied to a MOSFET in which a semiconductor layer made of SiC is formed in contact with an insulating film.

DESCRIPTION OF THE REFERENCE SIGNS 1, 3: MOSFET; 2: substrate; 10: gate electrode; 12: drain electrode; 18: back-side contact electrode; 21, 31: semiconductor layer; 23: well region; 24: source region; 25: contact region; 26: insulating film; 27: source electrode; 28: interlayer insulating film; 29: drain region; 30: MOS capacitor.

The invention claimed is:

1. A MOSFET comprising:
   a silicon carbide substrate having a main surface having an off angle of not less than 50° and not more than 65° relative to a {0001} plane;
   a semiconductor layer formed on said main surface of said silicon carbide substrate; and
   an insulating film formed in contact with a surface of said semiconductor layer,
   the MOSFET having a sub-threshold slope of not more than 0.4 V/Decade.

2. The MOSFET according to claim 1, further comprising a region including a nitrogen atom and interposed between said semiconductor layer and said insulating film.

3. The MOSFET according to claim 2, wherein a maximum value of nitrogen concentration is $1\times10^{21}$ cm$^{-3}$ or greater in said region at a portion distant away by 10 nm or smaller from an interface between said semiconductor layer and said insulating film.

4. The MOSFET according to claim 1, wherein said semiconductor layer is formed of silicon carbide.

5. The MOSFET according to claim 1, wherein said main surface of said silicon carbide substrate has an off orientation falling within a range of ±5° of a <11-20> direction.

6. The MOSFET according to claim 1, wherein said main surface of said silicon carbide substrate has an off orientation falling within a range of ±5° of a <01-10> direction.

7. The MOSFET according to claim 6, wherein said main surface of said silicon carbide substrate has a plane orientation having an off angle of not less than −3° and not more than +5° relative to a plane orientation {03-38}.

8. The MOSFET according to claim 6, wherein said main surface of said silicon carbide substrate has an off angle of not less than −3° and not more than +5° relative to a (0-33-8) plane in the <01-10> direction.

9. A method for manufacturing a MOSFET, comprising the steps of:
   preparing a silicon carbide substrate having a main surface having an off angle of not less than 50° and not more than 65° relative to a {0001} plane;
   forming a semiconductor layer on said main surface of said silicon carbide substrate; and
   forming an insulating film in contact with a surface of said semiconductor layer,
   the MOSFET having a sub-threshold slope of not more than 0.4 V/Decade.

10. The method for manufacturing the MOSFET according to claim 9, wherein the step of forming said insulating film includes the steps of: forming said insulating film by dry oxidation; and thermally treating said insulating film using gas including a nitrogen atom as atmospheric gas.

* * * * *